United States Patent
Buijsse

(10) Patent No.: US 9,293,297 B2
(45) Date of Patent: Mar. 22, 2016

(54) CORRELATIVE OPTICAL AND CHARGED PARTICLE MICROSCOPE

(71) Applicant: FEI Company, Hillsboro, OR (US)

(72) Inventor: Bart Buijsse, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 14/606,850

(22) Filed: Jan. 27, 2015

(65) Prior Publication Data
US 2015/0214001 A1    Jul. 30, 2015

(30) Foreign Application Priority Data
Jan. 27, 2014    (EP) .................................... 14152582

(51) Int. Cl.
*H01J 37/26* (2006.01)
*H01J 37/22* (2006.01)
*H01J 37/20* (2006.01)

(52) U.S. Cl.
CPC ............. *H01J 37/226* (2013.01); *H01J 37/20* (2013.01); *H01J 37/261* (2013.01); *H01J 2237/14* (2013.01); *H01J 2237/20214* (2013.01); *H01J 2237/223* (2013.01); *H01J 2237/2602* (2013.01)

(58) Field of Classification Search
USPC .......................... 250/306, 307, 309, 310, 311
See application file for complete search history.

(56) References Cited

U.S. PATENT DOCUMENTS

| | | | |
|---|---|---|---|
| 6,373,070 B1 | 4/2002 | Rasmussen | |
| 7,671,333 B2 | 3/2010 | Agronskaja et al. | |
| 7,675,034 B2 | 3/2010 | Faber | |
| 2008/0283777 A1 | 11/2008 | Herschbein | |
| 2009/0212213 A1* | 8/2009 | Nakasuji et al. | 250/310 |
| 2009/0230304 A1* | 9/2009 | Hatano et al. | 250/311 |
| 2013/0119267 A1 | 5/2013 | Deshmukh et al. | |
| 2014/0299769 A1* | 10/2014 | Okai et al. | 250/310 |

FOREIGN PATENT DOCUMENTS

EP    1724809 A1    11/2006

OTHER PUBLICATIONS

Unknown, "Tecnai with iCorr, Enabling correlative microscopy on the Tecnai TEM" FEI data sheet DS012-10-2013.

* cited by examiner

*Primary Examiner* — Nicole Ippolito
(74) *Attorney, Agent, or Firm* — Scheinberg & Associates, PC; Michael O. Scheinberg

(57) ABSTRACT

A Correlative Light and Electron Microscope (CLEM) is equipped with a TEM column and a light microscope fitted between the pole shoes of the objective lens of the TEM. To enlarge the acceptance solid angle for enhanced sensitivity a truncated lens is used. It is noted that this does not imply that the lens shows astigmatism (it is not a cylindrical lens).

Using the light microscope, a first image is made with the sample in a first direction. This image will show in one direction a higher (diffraction limited) resolution than in the direction perpendicular thereto, due to the different NA of the lens in the two directions. By rotating the sample and making a second image, a combined image can be formed showing a better resolution than either of the images in the direction where they show a low NA.

20 Claims, 3 Drawing Sheets

CORRELATIVE OPTICAL AND CHARGED PARTICLE MICROSCOPE

The invention relates to an apparatus equipped to perform correlative optical microscopy and charged particle microscopy, the apparatus comprising:

A charged particle column showing a charged particle source for producing a beam of charged particles along a particle-optical axis and a magnetic objective lens comprising two pole shoes for focusing said charged particle beam, a sample position located between the pole shoes, An optical microscope for imaging a thin flat sample located at the sample position, the optical microscope showing an optical axis perpendicular to the particle-optical axis, A sample holder for holding the thin flat sample in an orientation in which the thin flat sample can be imaged by the particle-optical axis, and in another orientation in which the thin flat sample is perpendicular to the optical axis, The invention further relates to a method of using such an apparatus.

Such an apparatus is known from U.S. Pat. No. 7,671,333. This known patent describes a Transmission Electron Microscope (TEM) with a retractable scanning optical microscope (SOM) mounted in the plane in which the sample resides, the optical axis of the SOM perpendicular to and intersecting the electron-optical axis of the TEM. By tilting the sample towards the optical microscope a fluorescent image can be made by irradiating the sample with a scanned laser beam. This beam excites fluorescent markers in the sample. In response to said stimulation photons are generated, which are collected by the objective of the optical lens and subsequently detected. These markers are made to attach to specific part of, for example, tissue, as a result of which the fluorescent image shows for example lipid layers, or specific enzymes, or such like. This information is then used to define an area of interest for the TEM.

It is noted that in a TEM a sample need not be imaged while perpendicular to the particle-optical axis of the TEM, but is often imaged at different angles, for example when making a tomogram. In extreme cases the sample is imaged while it is tilted by e.g. 70 degrees with respect to the perpendicular position.

It is further noted that also correlative microscopy, combining different sorts of information from optical and electron microscopy, is known to be used.

It is worth mentioning that also in transmission electron microscopy markers are used, but typically these comprise heavy metals (for example gold- or silver clusters), contrasting in biological material due to their high-Z composition. The use of, for example, gold-nanoparticles, both acting as fluorescent markers and heavy metal markers, is also known.

The use of a SOM is rather expensive, and the use of a non-scanning microscope would, from a financial viewpoint, be preferred. However, the known patent deems this unpractical, as the space between the lens poles is limited and lenses that fit between the lens poles are necessarily limited in their Numerical Aperture (NA).

The NA is defined as $\sin(\theta)$, with $\theta$ the maximum acceptance angle, and assuming the refractive index equals one ($n=1$), as is the case in air and vacuum.

Therefore the known patent points to use a simple lens without chromatic correction.

Also, even though the SOM does not suffer from chromatic aberrations, as the exciting beam of light that is relevant for the positional accuracy is monochromatic, the diffraction-limited resolution limit, equal to $0.61\lambda/NA$, is limited by the NA of the lens, as is the sensitivity, which is proportional with the acceptance solid angle of the objective lens, thus proportional to $(NA)^2$.

Another such apparatus is the commercially available Tecnai™ with iCorr™ sold by FEI Co., Hillsboro, Oreg., USA, as described in product data sheet DS0126-12-2012, "Tecnai™ with iCorr™, enabling correlative microscopy on the Tecnai TEM". Such an instrument is also named a Correlative Light-optical and Electron Microscope (CLEM). This apparatus uses a LED based fluorescent light microscope in combination with a transmission electron microscope. In the second orientation, where the thin flat sample is perpendicular to the light optical axis, the light microscope collects images in reflection and/or fluorescent mode. This apparatus uses a standard, non-scanning, set-up for the fluorescent microscope and thus needs an achromatic objective lens. Such a lens is much more complex than a monochromatic objective lens, and the objective lens is a 15×/0.5 NA lens, as larger lenses (with a higher NA) do not fit between the pole pieces.

The NA of this lens of 0.5, limits the resolution of the fluorescence microscope: the diffraction-limited resolution is equal to $0.61\lambda/NA$, with $\lambda$ the wavelength of the light.

As the acceptance solid angle of the objective lens is limited, also the sensitivity is limited (the sensitivity is proportional to the solid angle accepted by the lens, thus proportional to $NA^2$).

There is a need for an apparatus with an improved optical microscope offering high resolution combined with high sensitivity within the physical constrains of the pole pieces of the magnetic lens.

The invention intends to provide an apparatus equipped with such an improved optical microscope, and a method for using an apparatus equipped with such an improved optical microscope, without changing the pole pieces of the magnetic lens or the distance between said pole pieces.

To that end the apparatus according to the invention is characterized in that the optical microscope has an objective lens that is non-rotationally symmetric and is truncated to fit between the pole pieces of the magnetic objective lens, with the size parallel to the particle-optical axis smaller than the size perpendicular to the particle-optical axis, thereby showing different numerical apertures in two directions, and thus different resolutions in two directions, and the acceptance solid angle for gathering light is larger than the acceptance angle of the largest rotationally symmetric lens fitting between the pole pieces.

In the following text $NA(\phi)$ of a lens can be a function of $\phi$, where $\phi$ is the orientation of the lens perpendicular to the optical axis. Therefore the $NA(\phi)$ of a lens in one orientation can differ from the NA of the same lens in another orientation. As the lens is truncated to fit between the pole pieces, the NA in the direction parallel to the particle-optical axis will be the smallest NA, while perpendicular thereto the largest NA occurs.

The invention is based on the insight that the diameter of a rotationally symmetric lens physically limits access between the magnetic lens poles. A larger diameter is only possible with a larger distance from the sample position, and therefore the acceptance solid angle (and thus the sensitivity) is not improved by larger diameters. The same holds for the resolution.

Inventors realized that by making the lens non-rotationally symmetric by e.g. truncating part of the lens, or using oval lenses, it is possible to have a larger acceptance solid angle (thus: sensitivity) and in one direction a higher diffraction limited resolution than in another (the orientation associated with the largest diameter shows the highest resolution).

It is noted that "non-rotationally symmetric" here means that the front surface of the lens does not show rotational symmetry. It is not intended to imply that the lens is a lens showing a focal distance that is not rotationally symmetric, such as occurs with cylindrical lenses.

It is noted that, by defining a lens with different NA($\phi$) in two directions, it is assumed that this lens defines the beam limitations, and that, if other optical elements present a physical limitation, these are truncated as well.

It is noted that US patent application publication number US2013/0119267A1 discloses a sample holder with optical components to focus a laser beam onto the sample. In its paragraph [0019] it mentions that these components can be used for detection of cathodoluminescence as well. The optical system is configured to work with a sample that is oriented perpendicular to the particle beam. The publication does not disclose an optical system for optical microscopic inspection or imaging of the sample while the sample is tilted away from the particle beam.

European patent application EP1724809A1 discloses an a-spherical lens to form an optical image of a sample. The optical system is configured to work with a sample that is oriented perpendicular to the particle beam. The sample is not placed between the pole pieces of the objective lens of the particle-optical microscope.

US patent application publication number US2008/0283777A1 discloses yet another optical system comprising mirrors/prisms configured to work with a sample that is oriented perpendicular to the particle beam. The sample is not placed between the pole pieces of the objective lens of the particle-optical microscope.

In an embodiment the sample holder is in the second orientation equipped to rotate the sample over 90 degrees in a plane perpendicular to the optical axis.

When making one image, the image will in one direction show a better (diffraction limited) resolution than in the direction perpendicular to that, due to the difference in NA of the objective lens in the two directions. By now equipping the apparatus with a sample holder that can rotate the sample over 90 degrees in a plane perpendicular to the optical axis, two images can be formed, each with its optimum resolution in a direction perpendicular to the optimum resolution of the other.

By combining the two images, an image can be formed with a resolution better than the resolution that can be obtained by a non-truncated lens. Such a combination can be achieved by, for example, adding the Fourier transform of each image and then reconstructing the image using the added Fourier transform. This can be the addition of two images perpendicular to each other, but also the addition of many images under different angles.

It is noted that the alignment can be performed before the Fourier transform, or after the Fourier transform, but evidently should be done before combining the images The skilled artisan will recognize that this embodiment also comprises the imaging, aligning and combining of more than two images, each image having a different orientation.

In a preferred embodiment the charged particle source is an electron source and the beam of charged particles is an electron beam.

This embodiment comprises apparatuses equipped with a Transmission Electron Microscope (TEM) column, a Scanning Transmission Electron Microscope (STEM) column, or a column capable of operating as either a STEM and TEM column (also referred to as a (S)TEM column)

In another embodiment the objective lens of the optical microscope is retractable.

By making the lens retractable the glass surface of the lens is, during imaging with the particle-optical beam, removed from the sample position. Thereby undesired effects, such as charging of the lens surface due to for example electrons, are avoided. Also contamination of the lens, possibly leading to reduced transparency of the lens, is avoided.

In yet another embodiment at least part of the objective lens is coated with a thin conductive, transparent layer, more specifically a layer of Indium Tin Oxide (ITO).

By making the surface of the objective lens facing the charged particle beam conductive, charging is avoided.

In an aspect of the invention a method of using an apparatus according to the invention comprising the steps of positioning the sample so that the surface faces the optical microscope; and obtaining a first image with the optical microscope, is characterized in that, after obtaining the first image, the sample is rotated in the plane perpendicular to the optical axis, and a second image is taken with the optical microscope; and the first and the second image are aligned and combined to form an image with a higher resolution than the first image in the direction parallel to the particle-optical axis shows.

In an embodiment of the method the rotation is a rotation over 90 degrees.

In another embodiment of the method the objective is retracted after taking the images using the optical microscope and prior to taking the image with the charged particle column.

To avoid for example charging the objective lens of the optical microscope is preferably retracted prior to the formation of the charged particle image to avoid disturbance of the beam due to charging of the lens, and to avoid contamination on the lens.

In yet another embodiment the combining comprises forming a Fourier transform of each image, adding the Fourier transforms, and reconstructing an image based on the added Fourier transforms.

Preferably a weighing is performed so that the high frequency information in each of the images is enhanced so that in the reconstructed image the high spatial frequencies are correctly represented.

In still another embodiment the combining comprises first adding the images and then suppressing low frequencies of the each or first suppressing low frequencies in each of the images and then adding the images.

This has almost the same effect as the earlier mentioned Fourier transform. The suppression can be performed by treating the images with a high pass kernel. A similar result can be accomplished in the combined (added) image.

In still another embodiment of the method the method further comprises obtaining an image using the particle-optical column.

Preferably the formation of this high resolution image (that may be an optical reflection image, a fluorescent image, a Raman image, or such like) is followed by rotating the sample in a plane perpendicular to the particle-optical axis and forming an image with the charged particle column, more specifically an electron optical image.

BRIEF DESCRIPTION OF THE DRAWINGS

The invention is now further elucidated using figure, in which identical reference numerals refer to corresponding features.

To that end.

DETAILED DESCRIPTION OF EMBODIMENTS

Figure 1:
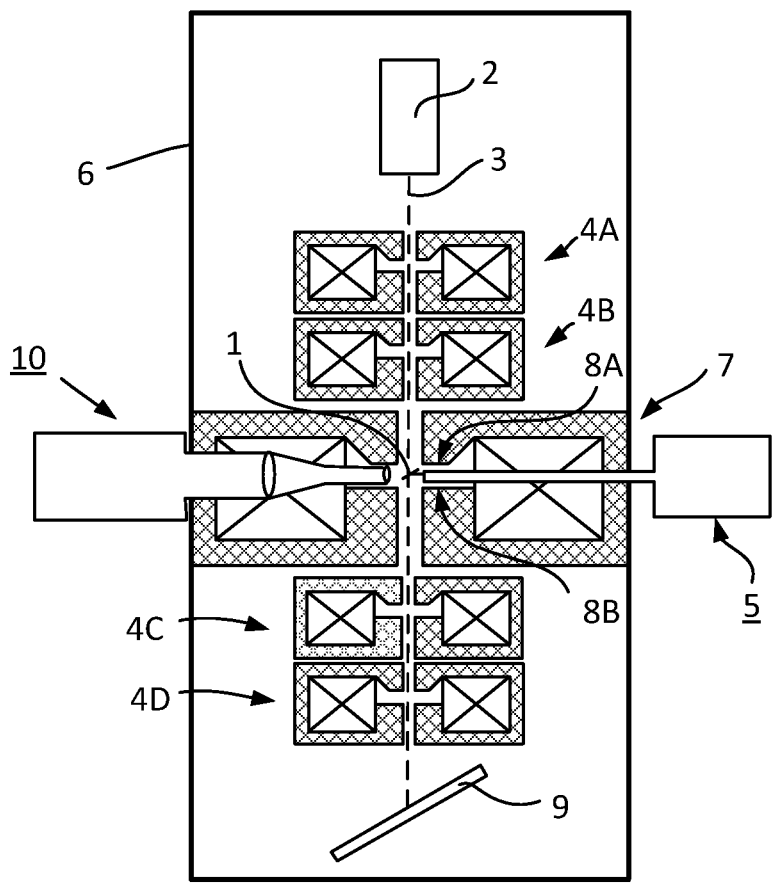
FIG. 1 schematically shows a part of a Transmission Electron Microscope equipped with an optical microscope, FIG. 2 schematically shows a front view (from the sample position) to the truncated lens FIG. 3A schematically shows a side view of the tubus of the microscope between the pole shoes of the magnetic lens, FIG. 3B schematically shows a side view of the tubus of the microscope in the plane perpendicular to the particle-optical axis.

FIG. 1 shows a vacuum chamber 6 in which a particle source 2 is located. The particle source generates a beam of particles, e.g. in the form of an electron beam in which the electrons have an energy of e.g. 300 keV, along particle-optical axis 3. The electron beam is manipulated (focused) by particle-optical lenses 4A, 4B arranged round the particle-optical axis.

Sample holder 5 is used to position a sample 1 onto the first sample position, where the beam of particles impinges on the sample. The first sample position is located between the pole faces 8A, 8B of the particle-optical objective lens 7.

The part of the electron beam transmitted through the sample is imaged by the particle-optical lenses 4C, 4D on a detector 9 in the form of e.g. a fluorescent screen or a CCD camera (or a camera of another principle). Also photographic film may be used to detect the particles. Other detectors, such as Electron Energy Loss Spectroscopes (EELS), may be used.

A light-optical microscope 10 enables observation of the sample when it is in the sample position, but tilted to the light-optical microscope.

As mentioned earlier the sample is normally a flat, very thin sample. For high resolution images the sample is often less than 100 nm thick, preferably even less than 50 nm thick. Such a sample is very fragile and therefore it is supported on a grid, e.g. a copper grid, said grid mounted on the sample holder 5. Such grids are known to the person skilled in the art as TEM grids.

To observe an area of interest of the sample with the particle beam the area of interest is brought on the particle-optical axis with the sample holder 5. While observing the sample with the particle beam, the orientation of the sample can be perpendicular to the particle-optical axis, but for certain techniques, such as 3D tomography, the sample may also be tilted with respect to the particle-optical axis.

To enable positioning the sample to meet these demands, the sample holder is able to position the sample with e.g. 3 translational and 2 rotational degrees of freedom, although also sample holders with less or even more degrees of freedom are known.

All sample positions/orientations that may be used to image the sample with the particle beam are referred to as the first sample position.

The optical microscope 10 observes a position between the pole shoes (also named pole faces) 8A, 8B. To form the best image with the optical microscope the sample needs to be tilted to a position substantially perpendicular to the optical axis of the optical microscope.

The optical microscope, or at least that part of the optical microscope closest to the particle-optical axis, is retractably mounted, and can be retracted to offer more space round the sample when the sample is not observed with the optical microscope. This additional space may be needed to offer access to the sample by e.g. other types of detectors, such as the commonly known secondary electron detectors, X-ray detectors, etc. that may be used to gather information about the sample when the sample is irradiated with the electron beam.

It is remarked that in this figure sample holder 5 and optical microscope 10 are depicted as sharing a plane perpendicular to the particle-optical axis 3 and are positioned opposite to each other. This is not necessary, and also embodiments where the holder and optical microscope are in a plane but spaced e.g. 90 degrees or 120 degrees apart, are possible. It is also possible that one or both elements show a symmetry axis that is not perpendicular to the particle-optical axis.

Figure 2:
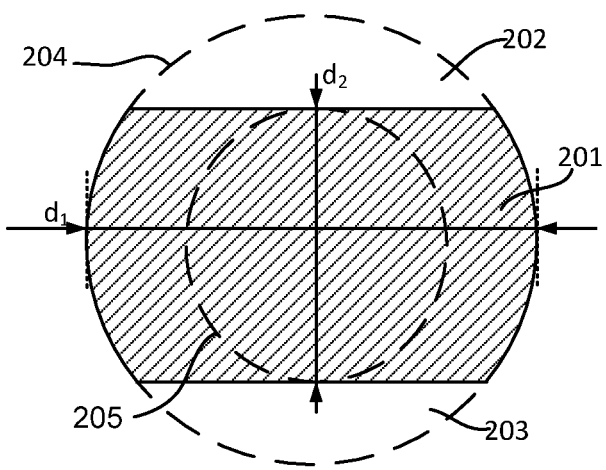

FIG. 2 schematically shows a front view (as seen from the sample position) to the truncated lens FIG. 2 shows a (glass) surface 201 that can be thought to be formed from a round lens with outer diameter 204. By removing parts 202 and 203 from such a lens, a truncated lens 201 is left over. Diameter $d_1$ is oriented in the plane perpendicular to the particle-optical axis 3 of the particle-optical column. Diameter $d_2$ is oriented parallel to the particle-optical axis.

It is noted that the largest round lens that would fit between the pole shoes would have a diameter of circle 205, equal to $d_2$. It is easily seen that the acceptance angle of the truncated lens is much bigger, and thus the sensitivity. Also the NA of the truncated lens in the direction of d1 is much larger than the NA in the direction of $d_2$, and thus the diffraction limited resolution in the direction of $d_1$ is much better than that in the direction of $d_2$, or the resolution of the largest rotationally symmetric lens that would fit between the pole shoes.

Figure 3A:
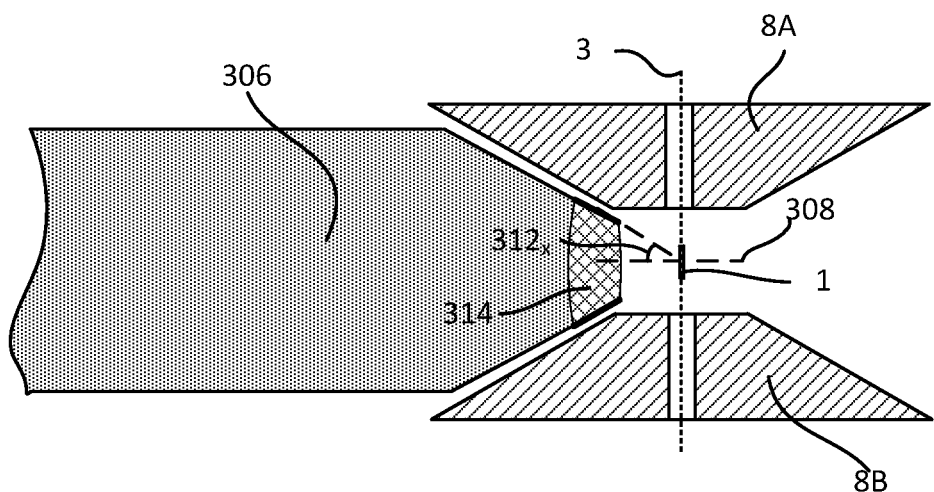

FIG. 3A schematically shows a view of the tubus of the optical microscope fitting between the pole shoes.

FIG. 3A schematically shows the two pole shoes 8A, 8B forming part of the magnetic lens of the particle-optical column (more specifically the magnetic objective lens of a TEM or STEM). The particles (electrons) travel along particle-optical axis 3. A sample 1 is shown on the intersection of the optical axis 308 of the optical microscope and the particle-optical axis 3 in the second orientation, where it faces the objective lens 314 of the optical microscope. The objective lens 314 is mounted in a tubus 306. The acceptance angle of the lens in this plane is $312_x$.

Figure 3B:
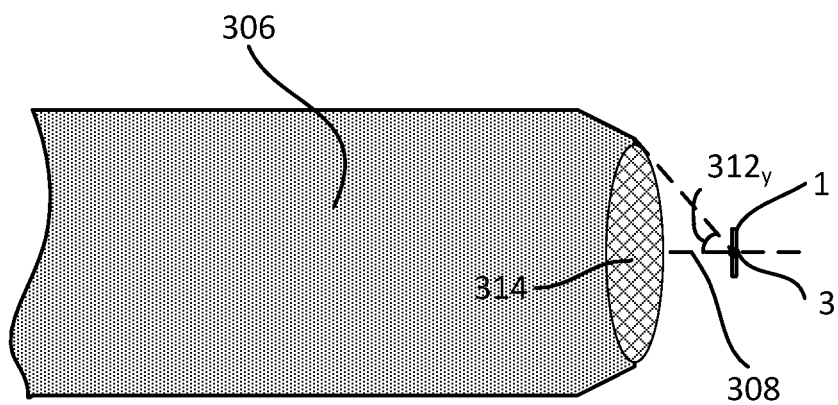

FIG. 3B schematically shows the tubus of the optical microscope in a plane perpendicular to the particle-optical axis 3.

FIG. 3B shows the tubus 306, the objective lens 314, the sample 1, the optical axis 308, as well as the intersection with the particle-optical axis 3. Also the acceptance angle $312_y$ is shown, which is markedly larger than the acceptance angle $312_x$ in the plane shown in FIG. 3A. As there are no obstructing pole shoes, these are not visible in this figure.

It is noted that the lens 314 is for simplicity here shown as a singlet lens. However, to form lenses with achromatic behavior, reduced aberrations etc., this lens is often formed as a compound lens.

Figure 4:
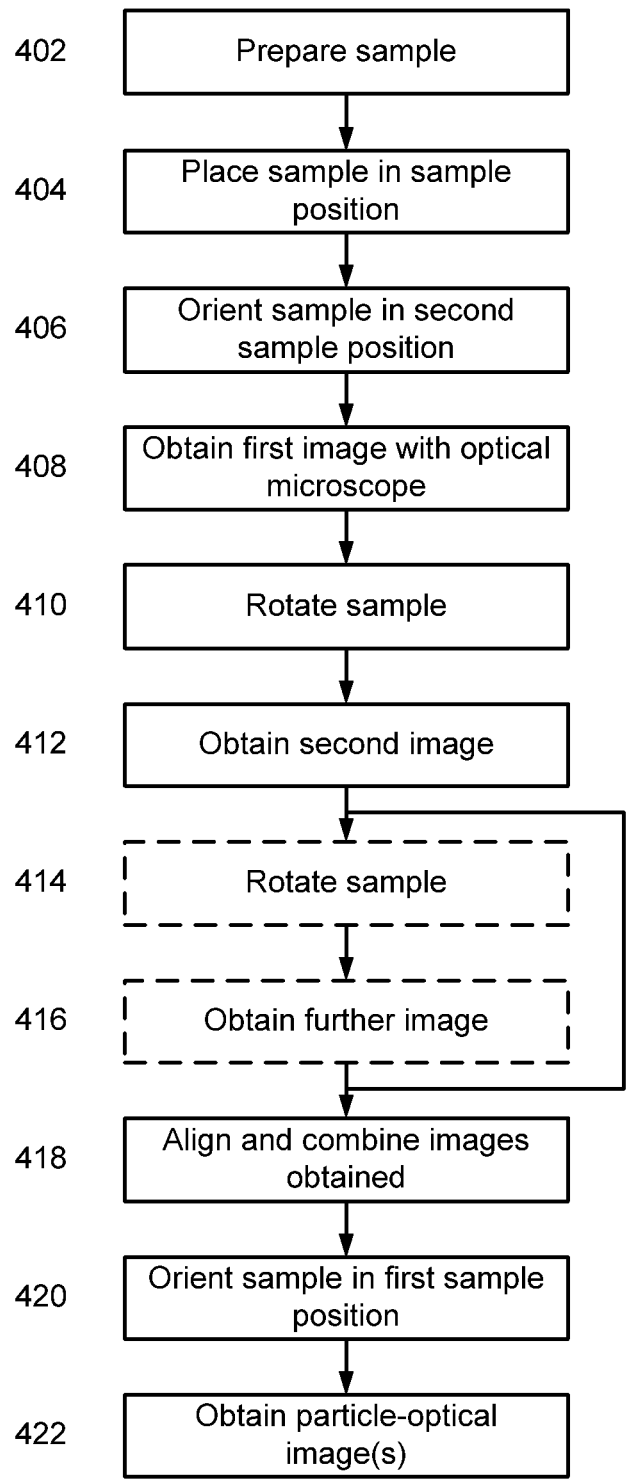
FIG. 4 shows a flowchart of a method for use.

FIG. 4 shows a flow chart of a method using the apparatus.

In step 402 the sample is prepared. This may include using an ultramicrotome to cut a lamella from a thick biological specimen, cryo-fixation, high-pressure freezing of a biological specimen, machining a part with an ion beam, excavating a lamella from a wafer, etc. The result of step 402 is a thin flat sample, often named a lamella.

In step 404 the sample is inserted in the apparatus at the sample position. This may involve placing the sample on a TEM grid, inserting the grid in a TEM-holder, and then inserting the TEM holder in the apparatus.

In step 406 the sample is oriented in the second sample position, i.e. in a position where the sample faces the objective lens of the optical microscope.

In step 408 a first image is obtained with the optical microscope. This may comprise exposing the sample to light as a result of which secondary radiation (often light with a longer wave length) is emitted.

In step 410 the sample is rotated in a plane perpendicular to the optical axis of the optical microscope. This may be a rotation over 90 degrees, but especially when a large number of images is collected, each showing a different orientation, also other rotation angles may be used.

In step 412 a second image is obtained.

In optional step 414 and 416 the sample is rotated and a further image is obtained at that different angle. These steps may be used to form a number of images, each showing a different orientation.

In step 418 the images obtained earlier are aligned and combined, for example using a Fourier transform for each image, an addition of all these Fourier transforms, followed by a reverse Fourier transform resulting in a final image, or by adding and filtering the image. It is noted that the alignment can be performed on the images, or in the Fourier transforms of each image.

In step 420 the sample is oriented in the first sample position

In step 422 an image with the particle-optical column is made. This may comprise a search for the area of interest, correlation of a low-magnification image with the data obtained from the optical image (using e.g. the position of fluorescent markers), forming a series of images at different tilt angles to form a tomogram, etc.

It is noted that for improved sensitivity a reflective coating at the backside of the sample may be applied. However, this is likely to hinder the imaging with a particle-optical column. Therefore placing a mirror on the side opposite to the side where the optical microscope is placed may be contemplated, thus making a reflected image available. However, it should be kept in mind that either the image of the sample or the reflected image is out-of-focus.

I claim:

1. An apparatus for performing correlative optical microscopy and charged particle microscopy, the apparatus comprising:
   a charged particle column comprising a charged particle source for producing a beam of charged particles along a particle-optical axis; and a magnetic objective lens comprising two pole shoes for focusing said charged particle beam;
   a sample position located between the pole shoes;
   an optical microscope for imaging a thin flat sample located at the sample position, the optical microscope showing an optical axis perpendicular to the particle-optical axis; and
   a sample holder for holding a thin flat sample in a first orientation in which the thin flat sample can be imaged by the particle-optical axis, and in a second orientation in which the thin flat sample is perpendicular to the optical axis;
   wherein:
   the optical microscope has an objective lens that is non-rotationally symmetric and is truncated to fit between the pole shoes of the magnetic objective lens, with the size parallel to the particle-optical axis smaller than the size perpendicular to the particle-optical axis, thereby showing different numerical apertures in two directions, and thus different resolutions in two directions; and
   the acceptance solid angle for gathering light is larger than the acceptance solid angle of the largest rotationally symmetric lens fitting between the pole shoes.

2. The apparatus of claim 1 in which the sample holder is in the second orientation equipped to rotate the sample over 90 degrees in a plane perpendicular to the optical axis.

3. The apparatus of claim 2 in which the charged particle sources is an electron source and the beam of charged particles is an electron beam.

4. The apparatus of claim 2 in which the objective lens of the optical microscope is a retractable lens.

5. The apparatus of claim 2 in which at least part of the objective lens is coated with a thin conductive layer.

6. The apparatus of claim 1 in which the charged particle source is an electron source and the beam of charged particles is an electron beam.

7. The apparatus of claim 6 in which the objective lens of the optical microscope is a retractable lens.

8. The apparatus of claim 1 in which the objective lens of the optical microscope is a retractable lens.

9. The apparatus of claim 1 in which at least part of the objective lens is coated with a thin conductive transparent layer.

10. The apparatus of claim 9 in which the thin conductive transparent layer comprises Indium Tin Oxide.

11. A method of using an apparatus according to claim 1, the method comprising the steps of:
    providing a thin flat sample (1) on the sample position;
    positioning the sample in the second orientation; and
    obtaining a first image of the sample with the optical microscope (10),
    wherein:
    after obtaining the first image, the sample is rotated in the plane perpendicular to the optical axis, and a second image is taken with the optical microscope;
    the first and the second image are aligned and combined to form an optical image with a higher resolution than the first image in the direction parallel to the particle-optical axis shows.

12. The method of claim 11 in which the rotation is a rotation over 90 degrees.

13. The method of claim 12 in which the combining comprises forming a Fourier transform of each image taken with the optical microscope, adding the Fourier transforms, and reconstructing an image based on the added Fourier transforms.

14. The method of claim 12 in which the combining comprises first adding the images taken with the optical microscope and the suppressing low frequencies of the each or first suppressing low frequencies in each of said images and then adding said images.

15. The method of claim 12 in which the method further comprises obtaining an image using the particle-optical column.

16. The method of claim 11 in which the method further comprises obtaining an image using the particle-optical column.

17. The method of claim 16 in which the objective lens is retracted after taking the images using the optical microscope and prior to taking an image with the charged particle column.

18. The apparatus of claim 17 in which the thin conductive transparent layer comprises Indium Tin Oxide.

19. The method of claim 11 in which the combining comprises forming a Fourier transform of each image taken with the optical microscope, adding the Fourier transforms, and reconstructing an image based on the added Fourier transforms.

20. The method of claim 11 in which the combining comprises first adding the images taken with the optical microscope and then suppressing low frequencies of the each or first suppressing low frequencies in each of said images and then adding said images.

\* \* \* \* \*